US012657507B2

(12) United States Patent
Patel et al.

(10) Patent No.: US 12,657,507 B2
(45) Date of Patent: Jun. 16, 2026

(54) METHOD AND SYSTEM FOR AN END-TO-END ARTIFICIAL INTELLIGENCE WORKFLOW

(71) Applicant: Lotus AI, LLC, Boston, MA (US)

(72) Inventors: Shabaz Basheer Patel, Palo Alto, CA (US); Anand Kiran Sampat, Palo Alto, CA (US)

(73) Assignee: Lotus IA, LLC, Boston, MA (US)

( * ) Notice: Subject to any disclaimer, the term of this patent is extended or adjusted under 35 U.S.C. 154(b) by 988 days.

(21) Appl. No.: 17/164,262

(22) Filed: Feb. 1, 2021

(65) Prior Publication Data

US 2021/0158219 A1　　May 27, 2021

Related U.S. Application Data

(63) Continuation of application No. 15/716,385, filed on Sep. 26, 2017, now Pat. No. 10,936,969.

(60) Provisional application No. 62/399,975, filed on Sep. 26, 2016.

(51) Int. Cl.
| | |
|---|---|
| *G06N 20/00* | (2019.01) |
| *G06F 8/00* | (2018.01) |
| *G06F 8/60* | (2018.01) |
| *G06F 8/71* | (2018.01) |
| *G06F 30/00* | (2020.01) |
| *G06N 5/01* | (2023.01) |
| *H04L 67/1074* | (2022.01) |

(52) U.S. Cl.
CPC ............... *G06N 20/00* (2019.01); *G06F 8/00* (2013.01); *G06F 8/60* (2013.01); *G06F 8/71* (2013.01); *G06F 30/00* (2020.01); *G06N 5/01* (2023.01); *H04L 67/1074* (2013.01)

(58) Field of Classification Search
None
See application file for complete search history.

(56) References Cited

U.S. PATENT DOCUMENTS

| | | | | |
|---|---|---|---|---|
| 2002/0082811 A1* | 6/2002 | Honjas | ................... | G06Q 10/04 |
| | | | | 703/2 |
| 2017/0063904 A1* | 3/2017 | Muddu | .............. | G06F 3/04847 |
| 2017/0091652 A1* | 3/2017 | Miao | ...................... | G06N 20/20 |
| 2017/0364703 A1* | 12/2017 | Jacob | ................. | G06F 21/6227 |
| 2024/0018863 A1* | 1/2024 | Ambade | ................ | E21B 41/00 |

* cited by examiner

*Primary Examiner* — David R Vincent
(74) *Attorney, Agent, or Firm* — Kwan & Olynick LLP

(57) ABSTRACT

In general, certain embodiments of the present disclosure provide methods and systems for enabling a reproducible processing of machine learning models and scalable deployment on a distributed network. The method comprises building a machine learning model; training the machine learning model to produce a plurality of versions of the machine learning model; tracking the plurality of versions of the machine learning model to produce a change facilitator tool; sharing the change facilitator tool to one or more devices such that each device can reproduce the plurality of versions of the machine learning model; and generating a deployable version of the machine learning model through repeated training.

20 Claims, 4 Drawing Sheets

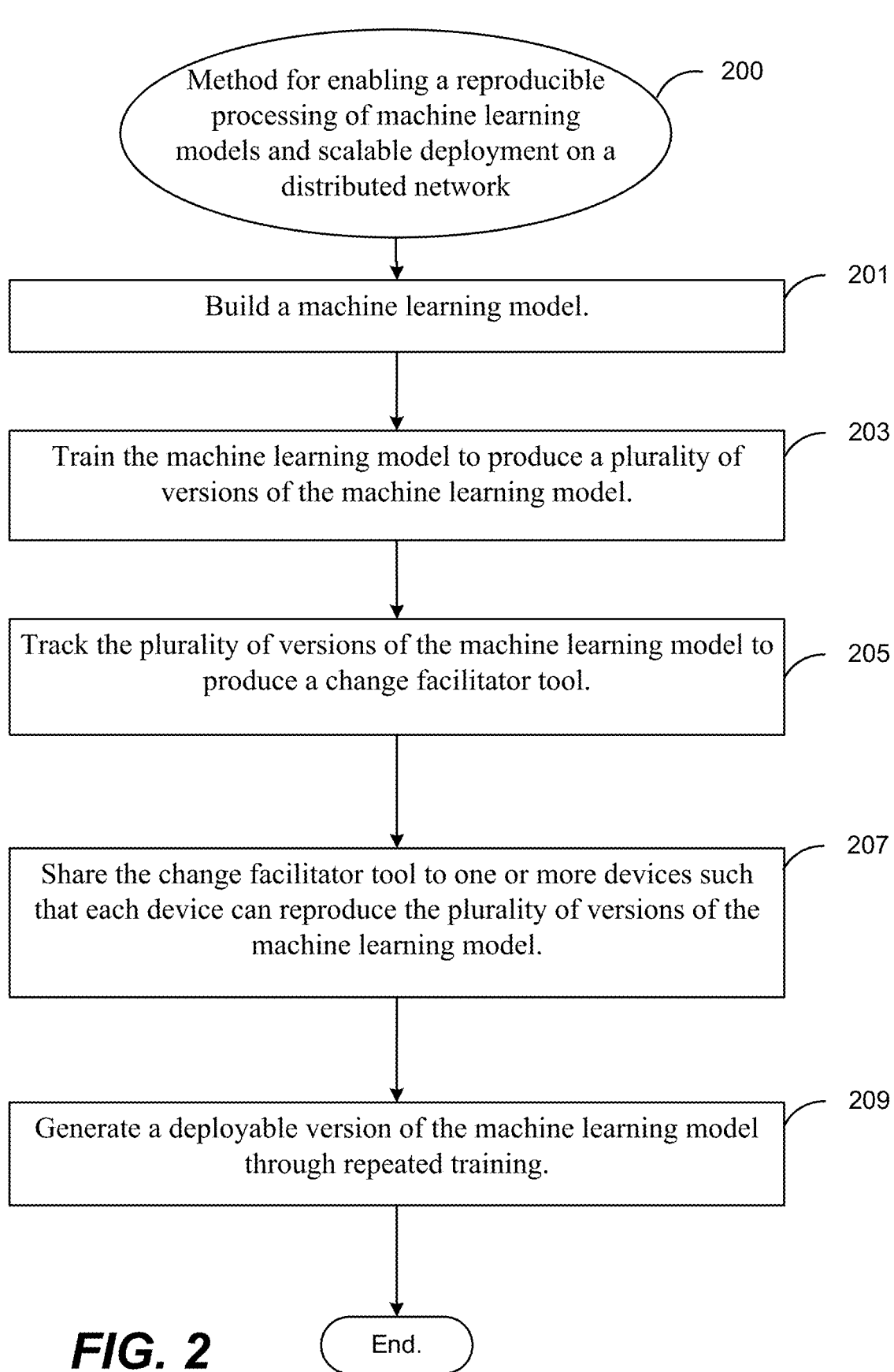

Method for enabling a reproducible processing of machine learning models and scalable deployment on a distributed network ⌐ 200

Build a machine learning model. ⌐ 201

Train the machine learning model to produce a plurality of versions of the machine learning model. ⌐ 203

Track the plurality of versions of the machine learning model to produce a change facilitator tool. ⌐ 205

Share the change facilitator tool to one or more devices such that each device can reproduce the plurality of versions of the machine learning model. ⌐ 207

Generate a deployable version of the machine learning model through repeated training. ⌐ 209

End.

*FIG. 2*

METHOD AND SYSTEM FOR AN END-TO-END ARTIFICIAL INTELLIGENCE WORKFLOW

CROSS-REFERENCE TO RELATED APPLICATIONS

This application is a continuation of and claims priority to U.S. patent application Ser. No. 15/716,385, by Shabaz Patel, et al., entitled "Method and System for an End-to-End Artificial Intelligence Workflow," filed on Sep. 26, 2017, which claims the benefit of U.S. Provisional Application No. 62/399,975, entitled "Method and System for Deep-Learning Based Search and Discovery of Media Content," filed on Sep. 26, 2016, all of which are incorporated by reference herein in their entirety for all purposes.

TECHNICAL FIELD

The disclosed embodiments relate generally to computer networks, more specifically, workflow management of artificial intelligence and machine learning models and deployment on distributed networks.

BACKGROUND

Modern computing systems are becoming smarter and smarter by the day. These connected and smart applications leverage data, machine learning, and artificial intelligence models to function. Building these models is possible today but with standard technologies available, this process can prove difficult. Manual tracking of work in a machine learning model is very cumbersome. Reverting back changes, maintaining versions, sharing versions for reproducibility, and seamless horizontally scalable deployment are challenges in the manual workflow. Thus, there exists a need for an improved workflow to provide a system of tracking and deployment which enables artificial intelligence models to be tracked, shared, and deployed in one system.

SUMMARY

In general, certain embodiments of the present disclosure provide methods and systems for enabling a reproducible processing of machine learning models and scalable deployment on a distributed network. The method comprises building a machine learning model; training the machine learning model to produce a plurality of versions of the machine learning model; tracking the plurality of versions of the machine learning model to produce a change facilitator tool; sharing the change facilitator tool to one or more devices such that each device can reproduce the plurality of versions of the machine learning model; and generating a deployable version of the machine learning model through repeated training.

BRIEF DESCRIPTION OF THE DRAWINGS

The disclosure may best be understood by reference to the following description taken in conjunction with the accompanying drawings, which illustrate particular embodiments of the present disclosure.

FIG. 2 illustrates an example flow chart for a method for enabling a reproducible processing of machine learning models and scalable deployment on a distributed network.

DESCRIPTION OF EMBODIMENTS

Figure 1A:
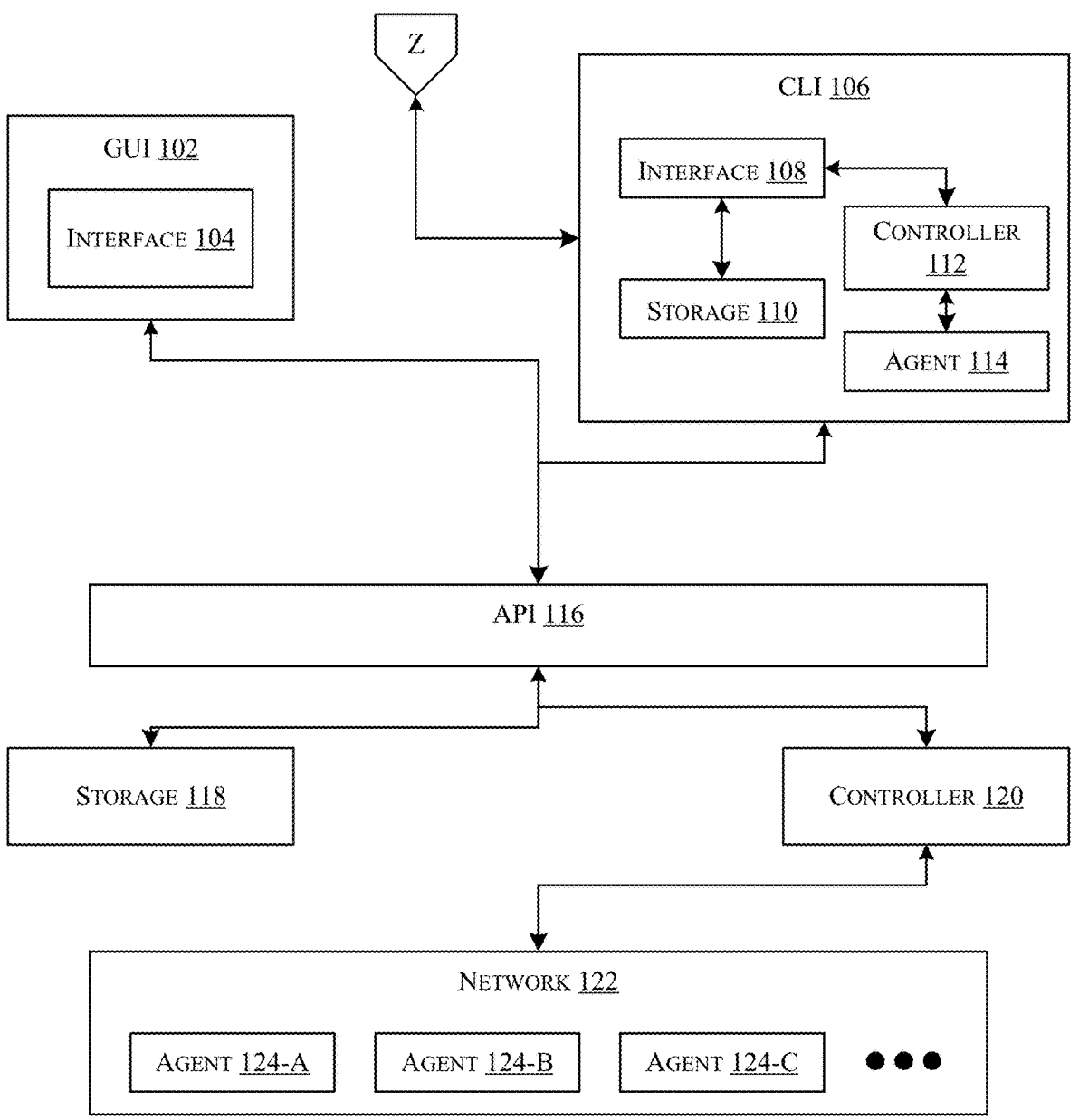
FIGS. 1A-1B illustrate a block diagram of an example architecture, in accordance with various embodiments of the present disclosure.

It will be understood that, although the terms "first," "second," etc. may be used herein to describe various elements, these elements should not be limited by these terms. These terms are only used to distinguish one element from another. For example, a first contact could be termed a second contact, and, similarly, a second contact could be termed a first contact, without changing the meaning of the description, so long as all occurrences of the "first contact" are renamed consistently and all occurrences of the second contact are renamed consistently. The first contact and the second contact are both contacts, but they are not the same contact.

The terminology used herein is for the purpose of describing particular embodiments only and is not intended to be limiting of the claims. As used in the description of the embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

As used herein, "Internal CMS" refers to content obtained from clients own repositories. As used herein, "Social Media" refers to content publicly available on social media websites.

Reference will now be made in detail to various embodiments, examples of which are illustrated in the accompanying drawings. In the following detailed description, numerous specific details are set forth in order to provide a thorough understanding of the present disclosure and the described embodiments. However, the present disclosure may be practiced without these specific details. In other instances, well-known methods, procedures, components, and circuits have not been described in detail so as not to unnecessarily obscure aspects of the embodiments.

Overview

In various embodiments, an example system is an end-to-end machine learning workflow tool, which creates a consistent flow to ingest source code, software and hardware environments, and miscellaneous files to create trained machine learning models which are deployed as applications and microservices. Certain embodiments provide methods and systems for tracking, sharing, and deploying artificial intelligence models. The system is configured for building artificial intelligence models. They are tracked by version which are designated as "snapshots". In the system snapshots and models are shared with other members. Versions of the models, or snapshots, are deployed as a module to be used in an applications. In order to build each snapshot of a model as well as make available the snapshot for use in production environments, broad task orchestration and execution of computer programs across many agents is described as well as a key component of the overall system. The system for building artificial intelligence models is a broader implementation of the specific implementation specified in below.

DETAILED EMBODIMENTS

Figure 1B:
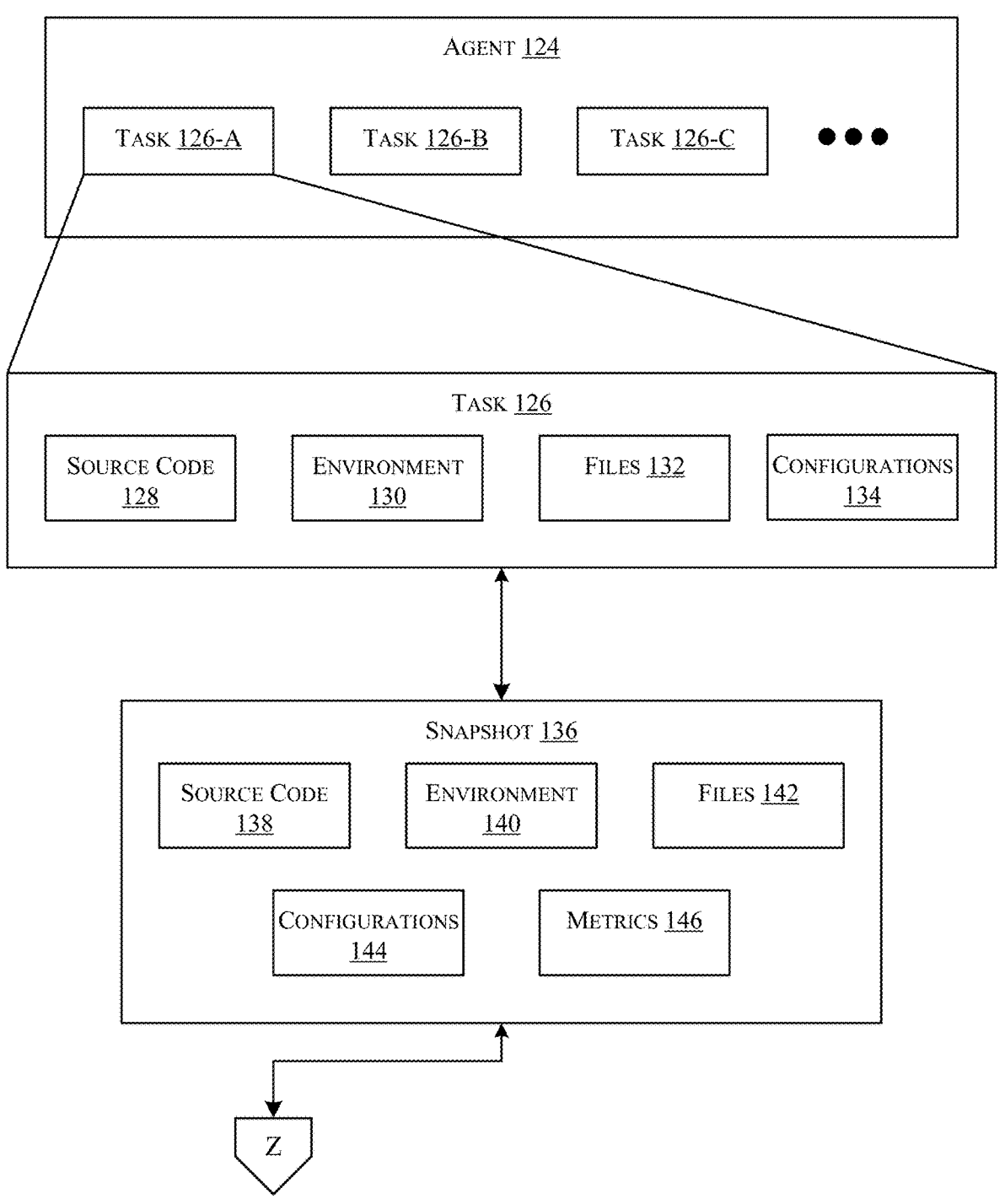

FIGS. 1A-1B illustrate a block diagram of an example architecture, in accordance with various embodiments of the present disclosure. The system interfaces with the user using 2 methodologies as shown in FIGS. 1A-1B: a graphical user interface (hereby known as GUI 102) and a command-line interface (hereby known as CLI 106). The image of the GUI 102 and the image of the CLI 106 connect to an application programming interface (API) which is shared and accessible by either interface. API 116 interfaces with a storage layer 118 to keep track of entities on the system. API 116 also interacts with a controller 120 which, via an agent network 122, orchestrates and allocates tasks to agents 124 (a local agent 114 is also running on every CLI instance 106), which are pieces of software that run on any hardware and utilize the resources for the purpose of executing computer programs over a computer network with a specific software environment specified by the user-customer via GUI 102 or CLI interface in 106 and transferred via the API interface in 116 and through controller 120. As depicted in FIGS. 1A-1B, an Agent 124 may be Agent 124-A, 124-B, and/or 124-C. Similarly, Task 126 may be represented as Task 126-A, Task 126-B, and/or Task 126-C, etc.

Graphical User Interface (GUI)—102

The purpose of GUI 102 is to provide the user a simple graphical user interface for building, tracking, sharing and deploying machine learning-based models. GUI 102 can be run on any server and is, in some embodiments, run via a web interface that is served through a computer network. The interface connects to the API block 116 that is accessed by the user via the web and through interactions with the browser. GUI 102 can be accessed by anyone with a web browser and access to the browser is accessed via a secure login. In some embodiments, the access to the website can be further restricted by the Internet Protocol address (IP address).

In some embodiments, GUI 102 has an interface in 104 with 5 key components: Task workspace pages, Model pages, Group pages, User profile pages, and Search pages.

In some embodiments the features of the Interface include a browser-based interface for the user to interact with the 5 key components. In some embodiments the Interface runs on a centralized computer network.

In some embodiments, the first feature of the Interface is a task workspace. The task workspace is a broader implementation of the specific tasks completed in the deep-learning media search implementation described below. Each of those embodiments describe a specific implementation of a task execution (as in each one is a task in an agent, like task 126). In some embodiments, the features of the task workspace include manipulating software environment, manipulating hardware environment and constraints, viewing available resources, setting performance constraints, estimating cost, and viewing inputs and outputs (logs, responses, etc).

In some embodiments, the second features is model pages for the task force include detailed descriptions of each model and their snapshot and task history. Specific implementations of models are described in the deep-learning media search implementation described below. Tasks executed for each of these models is described in the embodiments referred to in the Task workspace. Model versions, or snapshots, are obtained in the specific implementation via the model training process for the visual model as described in the deep-learning media search implementation described below.

In some embodiments, the third feature is Group (otherwise known as collections in some embodiments) pages. In some embodiments, the group pages include a list of models to bring a community together around models already in the system. In some embodiments, the group also enables a group discussion as well as the ability for a user to follow a group. In some embodiments, grouping models together enable user-customers to compare work with each other, as well as bring together distinct models for the purpose of creating a broader application. One specific implementation is mentioned in the deep-learning media search implementation described below, which combines multiple models, natural language processing, and computer vision, for the purpose of filtering content from social media.

In some embodiments, the fourth feature is user profile pages which include detailed descriptions of the user-customer and the models the user-customer has created or contributed to.

In some embodiments, the fifth feature is search pages which enable a user-customer to search for models, groups, and other users. In some embodiments, the implementation of the search page is further described in the deep-learning media search implementation described below, which uses similar techniques for domain specific language (DSL) query generation using ElasticSearch.

Command Line Interface (CLI)—106

In some embodiments, the purpose of the command line interface 106 is to provide the user a simple command line interface for building, tracking, sharing and deploying machine learning-based models. The installable computer software also serves to provide a method to work without connection to a cloud-based computer network with self-contained storage, controller, and an agent which adds the hardware to a network of agents available via a computer network. The components of this installable computer software also connect to the API block 116 via a computer network to connect to a cloud-based computer network just as GUI 102.

In various embodiments, the CLI 106 can be run on any piece of hardware. It is an installable piece of software that installs a few components that run on the hardware: a command-line interface is installed which enables the user to control their work as in 108, a local storage for entities 110, a local controller 112 to allocate tasks to proper agent(s) based on software/hardware constraints, an agent 114 that runs in the background and makes hardware available to the controller via a computer network. In some embodiments, CLI 106 can be accessed via a secure login. In some embodiments, access to the computer network can be restricted by IP address.

In some embodiments, the features of CLI 106 include: Interface, Storage, Controller, and Agent.

In some embodiments, the first feature is the Interface which includes Environment creation/manipulation. This includes software environments for running computer programs coded to train and build a model can be built and destroyed. Users can manipulate the build file, which specifies a set of instructions for each software environment and can create as many software environments as needed to run computer programs in different ways. In some embodiments, the software environment is specified to the controller before the agent will run the computer program. One specific implementation of the software environment is described in the deep-learning media search implementation described below, where the AcuNet architecture can run in order to train the weights. These embodiments also describe a specific implementation of a software environment for production use in order to deploy the task with a software environment into a controller, 120, to run prediction as a RESTful API for use over the network.

In some embodiments, the Interface includes Model creation/manipulation. In such embodiments, the user can put together a number of components to create a version of a trained model within the system. In some embodiments, such versions are referred to as snapshots. Snapshots are a capture of a model at a particular point in time. In some embodiments, a Snapshot is a fully reproducible entity which comprises of the following components: source code, files, environments, configurations, and performance metrics.

In some embodiments, the Source code is one component of this and is manipulated through a standard integrated development environment (IDE). The command line interface tracks this component with GIT and keeps a tab of the code version. Ingested data can be directly ported into the source code using connections to other storage locations. Source code can be broken up further into source code that processes the data, one implementation of which is described in the deep-learning media based search implementation as described below.

In some embodiments, files are large files that are tracked by the system separately from the source code. Large files can be data, any miscellaneous files, any weights files, or other visualizations. Data ingestion, as described in the deep-learning media based implementation, occurs here.

In some embodiments, environments are software environments that are specified and manipulated as above. They are also associated with a "Snapshot" in order to keep track of a version of a model.

In some embodiments, configurations are model configurations used during the task to create a version of a trained model. These are key-value pairs of variables that are noted for each version of the model. In some embodiments, configurations are tracked in a JSON object.

In some embodiments, performance metrics are metrics which specify the performance of models that are built with the system. Metrics are key-value pairs variables specified by the user and in some embodiments are tracked in a JSON object.

In some embodiments, the interface includes task orchestration: In some embodiments, the user can initiate tasks, as in 126, to run with a number of parameters which specify the type of agent to use, software environment, files, and source code.

In some embodiments, tasks 126 are a way to execute computer programs in a predictable and reproducible way. A task includes software and hardware environment specifications along with source code, and any files necessary to execute. The execution is passed to the controller to then pass the task information to agents for final execution. Outputs of the task are saved as files or as metrics captured once a snapshot of the model is captured.

The deep-learning media based search implementation describe specific tasks executed prior to the broader definition outlined above. Tasks can be any execution of a computer program, therefore, data processing and extraction, model training, as well as data preprocessing for use in models, which are all specific implementations.

In some embodiments, CLI 106 includes a second feature, Storage (database), which is a local version of database that mirrors functionality of the global storage. It is shown as 110 and matches the description of 118 below.

In some embodiments, CLI 106 includes a third feature, Controller, which is a local version of controller in 112 that mirrors functionality of the global controller described below and shown as 120.

In some embodiments, CLI 106 includes a fourth features, an Agent, which is a version of a background computer program running on hardware which facilitates the execution of tasks and shown as 114. This mirrors the functionality of 124.

Application Programming Interface (API)—116

In various embodiments, API 116 provides a common interface for user facing interfaces to access and manipulate the storage and controller blocks of the system. In some embodiments, API 116 is a computer program that is continually running on a cloud-based server and is accessible to be pinged via a computer network by GUI 102 and CLI 106, among other parts of the system. In some embodiments it can be run within a local area computer network.

In some embodiments, API 116 is broken down into distinct functions with distinct input and output components. The functions together create a common language for both GUI 102 and CLI 106 to easily access. In some embodiments, the functions perform all tasks necessary within the workflow to create trained models, version them, and deploy them for use in applications. Further descriptions of each of the functions is covered in the description of the storage details and controller details In various embodiments, API 116 includes storage API and orchestration API. In some embodiments, the storage API connects to storage block 118, described below. In some embodiments, the storage API and storage block 118 mirrors the functionality of each other. In some embodiments, orchestration API connects to controller block 120, described below. In some embodiments, the orchestration API passes information of tasks to run with a number of parameters which specify the type of agent to use, software environment, files, and source code to the correct agent 124 based on hardware availability.

Storage—118

In various embodiments, storage 118 maintains a persistent storage of important entities. In some embodiments, the storage database is a relational database with a number of tables representing each important entity on the platform. In some embodiments, the tables mirror the API functions used by the interfaces to manipulate the state of the system. In some embodiments, this is the permanent storage of information for all parts of the system and is accessed by API block 116 as well as directly by the command-line interface.

In some embodiments, the features of storage 118 include: Entity Tables, Model, Snapshot, Environment, Groups/collections, Task, and User.

Controller—120

In various embodiments, controller 120 allocates tasks 126 to proper agent(s) 124 based on software and hardware constraints. In some embodiments, controller 120 connects to agent network 122 via a standard messaging protocol over a computer network, and obtains information about agents in the network. In some embodiments, controller 120 uses information about agent 124 to allocate and send tasks 126 to the correct agent directly, which will finally execute the task on the hardware device it is running.

In some embodiments, controller 120 includes dynamic allocation in real-time of tasks 126 across a computer network to agents 124 that have the hardware resources available. In some embodiments, controller 120 can provision new computer servers and generate new agents on the required hardware dynamically if hardware resources are unavailable. In some embodiments, controller 120 shuts down agents 124 that are not actively processing tasks to boost cost and energy efficiency of the system.

Agent Network—122

In various embodiments, agent network 122 groups all available agents 124 for easy access by controller 120 to orchestrate and allocate task execution. In some embodiments, agent network 122 is a networked set of agents (as described below) enabled via a computer network. In some embodiments, controller block 120 taps into this network via a standard messaging protocol over a computer network, and uses information about agents in the network to make a decision about which agents to allocate tasks. In some embodiments, this orchestration is implemented via Docker Swarm; in some embodiments it is implemented via Kubernetes. In some embodiments, controller 120 uses information from the network and chooses an agent(s) to which to send the task. In some embodiments, agent network 122 aggregates all agents 124 for easy access to information about each one by controller 120.

Agent—124

In various embodiments, agent 124 is a piece of computer software that allocates and makes available hardware resources for the purpose of executing distinct reproducible tasks. In some embodiments, agent 124 runs as a daemon task (in the background of the machine) on the hardware it is installed on and in some embodiments requires administrator access to run successfully. In some embodiments, available hardware resources on the host machine is analyzed and key metrics and attributes of the resources are made available to the controller via a computer network. In some embodiments, agent 124 maintains a perpetual connection with controller 120 and is triggered to execute tasks 126 with a specific software environment as directed by controller 120 via a computer network. In some embodiments, agents are automatically spawned as needed. In various embodiments, agents are also always installed with a CLI 106, so the user-customer always has at least 1 agent in 114 to execute tasks to build the models.

In some embodiments, agent 124 runs on a piece of hardware and, based on commands made by controller 120 to which it connects, will instantiate task executions in distinct software environments. In some embodiments, task executions use specialized hardware available on the machine. In some embodiments, task executions are executed within Docker containers and outputs are made available directly to the user on the command line.

Task—126

In various embodiments, task 126 runs a self-contained computer program in a reproducible way. In some embodiments, the task is run using a Docker container. In some embodiments, inputs are obtained from the process top-down. In some embodiments, task 126 combines all relevant information for running the task and runs the task in a self-contained environment. The key components required are: source code, environments, files, configurations, and performance metrics.

In some embodiments, source code 128 is one component of task 126 and is manipulated through a standard integrated development environment (IDE). The command line interface tracks this component with GIT and keeps a tab of the code version. Ingested data can be directly ported into the source code using connections to other storage locations—this is a broader implementation of the deep-learning media based search implementation as described below. In some embodiments, source code can be broken up further into source code that processes the data.

In some embodiments, environments 130 are specified and manipulated as above. They are also associated with a "Snapshot" in order to keep track of a version of a model.

In some embodiments, files 132 are large files that are tracked by the system separately from the source code. Large files can be data, any miscellaneous files, any weights files, or other visualizations. Data ingestion as described in the deep-learning based search implementation is done here.

In some embodiments, configurations 134 are model configurations used during the task to create a version of a trained model. These are key-value pairs of variables that are noted for each version of the model. In some embodiments, configurations are tracked in a JSON object.

Snapshot—136

In various embodiments, snapshot 136 contains a reproducible version of a model by including all of the relevant components. In some embodiments, the user-customer can reproduce previous work and share work using the atomic unit of a snapshot. In some embodiments, the snapshot is completely self-contained and can be created at any time during the process. Before, during, or after a running of the task regardless of the agent. In some embodiments, the snapshot is an entity that is created and can be reverted and deployed using CLI 106 or GUI 102. Because the snapshot can both be reverted as well as created, arrow between 136 and 106 as well as 136 and 102 is double sided. This ensures that the process of building is iterative and enables the user-customer to continuously improve snapshot performance over time and jump between experiments by using GUI 102 or CLI 106.

In various embodiments, the components of snapshot 136 include source code 138, environments 140, files 142, configurations 144, and performance metrics 146. In some embodiments, source code 138 is manipulated through a standard integrated development environment (IDE). The command line interface tracks this component with GIT and keeps a tab of the code version. Ingested data can be directly ported into the source code using connections to other storage locations. Source code 138 can be broken up further into source code that processes the data, one implementation of which is described in the deep-learning media search implementation described below. In some embodiments, environments 140 comprises software environments that are specified and manipulated as above. They are also associated with a "Snapshot" in order to keep track of a version of a model. In some embodiments, files 142 are large files that are tracked by the system separately from the source code. In some embodiments, large files can be data, any miscellaneous files, any weights files, or other visualizations. Data ingestion as described in further detail below. In some embodiments, configurations 144 are model configurations used during the task to create a version of a trained model. These are key-value pairs of variables that are noted for each version of the model. In some embodiments, configurations are tracked in a JSON object. In some embodiments, performance metrics 146 are metrics which specify the performance of models that are built with the system. Metrics are key-value pairs variables specified by the user and in some embodiments are tracked in a JSON object.

FIG. 2 illustrates an example flow chart for a method for enabling a reproducible processing of machine learning models and scalable deployment on a distributed network. Method 200 only represents one possible method for implementing the systems described herein. Other possible implementations that include only a subset of the operations comprising method 200 may also be in accordance with embodiments of the specification.

Method 200 begins with building (201) a machine learning model. Next, method 200 includes training (203) the machine learning model to produce a plurality of versions of the machine learning model. Then, the plurality of versions of the machine learning model are tracked (205) to produce a change facilitator tool. Next, the change facilitator tool is shared (207) to one or more devices such that each device can reproduce the plurality of versions of the machine learning model. Last, a deployable version of the machine learning model is generated (209) through repeated training.

In some embodiments, tracking the plurality of versions includes tracking 5 components: source code, software environments, files, configuration parameters, and performance metrics. In some embodiments, the 5 components are tracked at the same time. In some embodiments, each version in the plurality of versions is a snapshot of all 5 components being tracked. In some embodiments, each snapshot allows for complete reproducibility across any machine. In some embodiments, the plurality of versions allows for running multiple tasks and pulling from multiple different snapshots in order to widen the search space to improve performance metrics to create improved snapshots. In some embodiments, the deployable version corresponds to the version with the best performing metrics.

Deep-Learning Based Search and Discovery of Media Content

One implementation of the methods and systems described above is a deep-learning based search and discovery of media content. For explanatory purposes, such an implementation will be described in detail below. In various embodiments, distributed scrapers and dataset are prepared for distributed training. In some embodiments, images are downloaded using a module called "Docker Master" that takes as input from the user the name of the dataset (e.g. "cars"), the name of the data source (e.g. "google", "flickr"), a set of query terms that are related (e.g. "van", "vehicle", "truck"), and a list of labels (e.g. "porche", "toyota", etc). In some embodiments, the "Docker Master" then creates a new remote server instance (e.g. Amazon Web Services EC2) for the dataset (e.g. "cars"). Within this instance a Docker container is created for each of the query terms. Each Docker container will start a process to acquire data from the aforementioned data source specified in the input for all of the labels within the list of labels using the query term associated with this container. It will make searches like "porche van", "toyota van", etc. The Docker container will download these files and store the labels and urls in a "data.csv" file in a bucket in cloud storage (e.g. Amazon Web Services S3) associated with the particular dataset name (as above). (e.g. the first line might be "<url>, porsche").

In various embodiments, an optional label expander for additional labels is included in the system. This module reads from the "data.csv" file within the cloud storage bucket associated with the dataset and produces more labels related to, but not exactly matching those already provided in the aforementioned step using Amazon Mechanical Turk. In some embodiments, the image url in the data.csv is used to display images in batches to the "Turkers" (remote workers) asking them to write in all of the objects and concepts they see. The aforementioned concepts include emotions (such as "happy" or "sad") as well as scenes (such as "panoramic", "close-up", etc) among others. In some embodiments, the output of this is a list of 10-20 labels per image, and is more in others. The output of the Mechanical Turk task is a comma separated list of labels for a given image url. In some embodiments, this result is written back into the same "data.csv" file in the cloud storage bucket with the url and the comma separated list of labels separated by one space (e.g. the first line would be "<url>porsche,car, design, . . . ").

In some embodiments, datasets are prepared using a DatasetPrepare module. The Dataset Prepare module consumes from a message queue that includes parameters to create batches. The parameters to create batches are the following: the number of images in the batch and the dataset from which the data is to be loaded. The steps to create these batches are as follows: 1) data urls from the "data.csv" file in the cloud storage bucket for dataset (e.g. "dataset-cars") are read into local storage; 2) from the same "data.csv" in 1), labels for the each of the images are also read into local storage. Here, "labels" are words that denote scene, concepts or objects—e.g. "panoramic", "happy", "car"; 3) the image urls from 1) are processed and converted into matrices of float values. The individual matrices are then grouped together into "batches" of a size determined by the user input; 4) in some embodiments, the "batches" or group of matrices are each saved as an ".npz file" (compressed file format to store the images in an efficient manner hereafter denoted by .npz file) to the same cloud storage bucket for the dataset.

In some embodiments, the Dataset Prepare modules consume messages from a queue to request a "batch". This "batch" will be the input the algorithm will take in after the initial request has been made (that is, when a message requesting the "batch" is sent to the queue mentioned above). In some embodiments, the Dataset Prepare module processes the message in the following steps: 1) if the batch for the dataset with the same parameters (number of images in batch, among others) has not already been created, it will follow the steps highlighted above to create the batches, otherwise it will continue to the next step; 2a) if the user specifies a random batch, it will read a random .npz file from the cloud storage bucket of the specified dataset; 2b) if the user specifies a specific batch, it will read a specific .npz file matching the index provided by the user 3) returns the name of the .npz file to the Dataset Interface module (detailed below).

In some embodiments, the dataset is passed into the training modules. The Dataset Interface for Training Models is a software package used by our training modules (and thus is present on the module that intends to train an algorithm) to interface with the Dataset Prepare module described above. It is a wrapper class for training code to use to interface with Dataset Prepare module. This enables two functions for the end use of training algorithms. First, the system gets a random batch for a particular dataset. This will send a message to the message queue from which the Dataset Prepare module consumes. The Dataset Prepare module will send a message to the Dataset Interface module when it is complete and then will return the numpy array of the batch back to the user. Second, the system gets a specific batch for a particular dataset. This will also send a message to the same queue from which the Dataset Prepare module will consume. The Dataset Prepare module will send a message to the Dataset Interface when it is complete and then will return the matrix of the batch back to the user.

In some embodiments, the Distributed Model training uses Dataset Prepare modules via the Dataset Interface as described above. Each of these Dataset Interfaces will communicate with one Dataset Prepare module. In some embodiments, further efficiency can be gained by having a number of Dataset Prepare servers that are polled by many Dataset Interfaces. That is, there is a one-to-one mapping between any 2 modules, but any Dataset Interface can be linked to any Dataset Prepare module. In this manner, any training code, no matter where it is running can access at least one Dataset Prepare module via the Dataset Interface and request the data required for training the model.

In some embodiments, the Model Training Process is as follows: 1) batches of images (batches can be of variable size depending on the amount of random access memory—RAM—available on the GPU. This is one of the parameters that is specified by the user) pass through the model in a "forward pass" which results in a vector of probabilities for all potential tags for each image in the batch; 2) at the end of this forward pass, there is a "ground truth" set of tags and probabilities for each tag that is used to calculate a "loss function". The "loss function" determines how closely the predictions of the "forward pass" match the "ground truth" values; 3) then this "loss function" is used to modify the weights of each of the layers through a "backward pass" through the model.

Artificial Intelligence Extraction of Content

In some embodiments, links for the following types of content—images, gifs, video stream, videos—are inputs to the extraction module. This module extracts visual and audio information from the content. The different types of content are processed in the following ways:

Image Preprocessing

In some embodiments, the image url is read into a matrix and the matrix is scaled to the proper size and format for input into our models.

GIF Preprocessing

In some embodiments, the GIF url is used to find the thumbnail image and the thumbnail image is read into a matrix. Then the matrix is scaled to the proper size and format for input into our models.

Video Preprocessing

In some embodiments, the video url is read in using ffmpeg and is sampled based on a variable sampling rate specified by the user. This results in a fixed matrix with a set number of frames stored in a 4 dimensional matrix that is stored in Random Access Memory (hereby denoted RAM) before processing. The video url is processed using ffmpeg and a way file is extracted from the entire video and saved to the cloud storage bucket. This audio file is converted to a spectrogram (i.e. a form of a matrix) in RAM during algorithm processing time.

Video Stream Preprocessing

In some embodiments, the video stream url is processed using ffmpeg and is sampled based on a variable sampling rate specified by the user on an ongoing basis until there is no more data within the stream. At every specified interval of time (also specified by the user), there is a set number of frames stored in a 4 dimensional matrix and that is stored in RAM before processing. This 4D matrix will be processed by the algorithm simultaneously while another set of frames are being read from the stream (as described above). The video stream url is processed using ffmpeg and a way file is extracted for a specified interval of time and saved to the cloud storage bucket until there is no more data within the stream. This audio file is converted to a spectrogram (i.e. a matrix) in RAM during algorithm processing time. This audio file will then be processed by the algorithm simultaneously while another set interval of audio way files is being read from the stream.

In various embodiments, the Audio and Visual models are implemented as follows:

Audio Models

In some embodiments, we use a pretrained Kaldi deep neural network models to extract speech information from the spectrogram created from an audio file which is extracted from video.

Visual Models

In some embodiments, the matrix that represents the image is given as an input and the histogram algorithm will calculate a histogram of pixel intensities and represent this as a vector of size depending on the image.

In various embodiments, the datasets are collected and passed into Convolutional Neural Networks. In some embodiments, the data was collected from public sites such as google images, yandex, bing and flickr and cleaned and batched as specified in the Training Data Pipeline.

In some embodiments, there are set models whose weights are loaded in from remote repositories that are saved by the training servers and that are shared via an cloud storage file system (S3) stored on our Amazon Web Services (AWS) accounts. In some embodiments we pass the preprocessed image through a trained Convolutional Neural Networks (CNN) with a pretrained model loaded as above in order to obtain a number of visual tags associated with the preprocessed image. In some embodiments, the visual tags are generated with a set ranking in order or decreasing probability and are obtained from the entire image.

In some embodiments, visual tags and audio tags extracted from images and videos is placed within an ElasticSearch Index for efficient search of content. The steps for indexing the visual and audio tags are described below:

Visual Indexing

The extracted visual information is the tags generated per frame in video and is used to generate indexes in Elasticsearch described below.

Clip Generation from Video

Frames are now combined into clips based on how similar the adjacent frames are. Similarity between frames are achieved if the intersection of tags generated in two frames exceed a particular fraction over its union of tags in same two frames. The equation used is shown below.

$$O(\text{visual tags}_{frame\ i} \cap \text{visual tags}_{frame\ j}) > (\text{threshold ratio}) * O(\text{visual tags}_{frame\ i} \cup \text{visual tags}_{frame\ j})$$

In some embodiments, the similarity between frames can also be achieved by using the Euclidian distance between features extracted using the CNN models for these frames. An empirical distance is determined as a threshold in order to classify the frame as a similar frame to the previous frame based on visual characteristics.

The similarity comparison is performed over all the consecutive frames with respect to a starting frame and clips are cut of at the frame where the similarity goes below a threshold ratio.

In some embodiments, the union of all visual tags in a clip from all of its frames is stored as the "vision classes" for this starting timestamp (determined as the timestamp of the first frame in the clip) and for a particular duration of the video clip.

Index Generation

In some embodiments, there exist two indices in elastic search (aka "elasticsearch"): all video table and in-video table All Video Table The purpose of this table is to find full videos from a query given to the ElasticSearch engine. In this index, we have one document type (term for tables used in ElasticSearch and hereby referred to as "table") for the video table. In some embodiments, each row corresponds to one video this table consists of columns: the video id (generated from the original video url), the union of all vision classes from the whole video, and all speech words extracted from the entire video.

In-Video Table

The purpose of this table is to find clips within videos and returns the timestamps of correlated clips in order to provide search for clips inside of the video. In some embodiments, this index consists of multiple tables, where each table corresponds to one video. The title of each table is the video id (generated from the original video url as above). Each table has rows corresponding to a clip within the specific video. Each table consists of the following columns: starting timestamp, duration of clip, the union of vision classes in all frames of the clip and speech words in the clip.

Audio Indexing

The extracted audio information is the speech words generated for the entire audio stream described in the section above. These speech words are indexed in the tables above to enable faster search.

Based on the clip generation by visual method describe above in "Clip Generation", in some embodiments, the total set of speech words is split and redistributed into sets of clips resulting in a subset of speech words being associated with each clip.

In some embodiments, the list of speech words spoken within the clip is stored in above mentioned column of video table based on the timestamp and duration of the clip described in "Index Generation" in "In-video Table"

In some embodiments, all the words spoken in the video are combined and stored in "All-Video Table", which represents the words spoken in the video as described in the "Index Generation" in "All-Video Table." This indexing enables search for videos using speech words.

Search

Search Query Generation

In some embodiments, the original search query is processed by our code to extract named entities (e.g. location, names, etc).

From the information extracted we then pass the location extracted from the query through the Google Geocode APIs to extract more details about the location For named entities and text not identified as named entities, we pass these words into the Google Knowledge Graph API. This extracts additional information about specific events, people, and places.

In some embodiments, the information extracted from the above processes is used to enhance the search for multimedia. The process of generating this information is also known as Search Query Expansion.

Finding Content from Social Media

The information extracted from the Search Query Generation is passed into the multimedia gathering. This includes keywords, locations, and named entities.

In some embodiments the keywords and named entities are used as queries for the search API on Twitter, Instagram, Youtube, Facebook, among others to obtain images, videos, and live streams (hereby called "media"). The location information is used as geo-location queries for the Twitter and Instagram APIs, among others to find a broader set of "media"

In some embodiments, the keywords are also used as input to the Twitter streaming APIs, among others to obtain real-time streams of data that match the keywords given.

Finding Content within Index

In some embodiments, search from an index uses the following method to find a ranked list of the most relevant video clips or images given a query by the user:

First, in order to get semantic understanding of user query to the generated visual tags, in some embodiments, the user's query is split into words and each word is converted to a vector using SpaCy word vectors of floats as in the "Multimedia Discovery" section for the Social Media Enterprise Discovery Tool.

In some embodiments cosine similarity distance metric of the query word vectors is calculated for the entire set of potential visual classes' word vectors. The list of visual classes will be ranked in decreasing order of cosine similarity, thereby providing a ranked list of visual classes associated with the user's query. Then from the list only the top visual classes above a particular threshold of cosine similarity (determined by empirical experimentation) are chosen for querying the ElasticSearch table.

We now generate ElasticSearch domain specific (DSL) query in order to get the best relevant result with the following steps:

In some embodiments, the DSL query includes the words within the exact query put in by the user along with the probable visual tags we generated in the previous step.

From the complete list of words being searched, in some embodiments, the DSL query will look for exact matches in each row. In some embodiments, we include a Boost (or higher weightage) for the vision class and speech words columns, where the Boost for the speech words is higher than that for vision classes.

In order to find the total results, in some embodiments, there are two DSL query calls that are performed over the tables in ElasticSearch.

The first DSL query call is performed over the all video table in order to get the most relevant videos for the query. This gives us the video id of the relevant videos in order of decreasing relevance.

The second DSL query call is performed over the in-video table for each of the videos returned in the previous call. This call gives the most relevant clips in each of the top videos based on the user's original query in order of decreasing relevance.

From the above two calls, we have result of most relevant videos and the most relevant clips in those videos.

Filtering Content from Social Media:

Early Filter

The media obtained from the multimedia gathering step is passed into this module, which processes the content with the following algorithm in order to flag content as relevant and find original versions of duplicate content. It uses the following algorithms.

In some embodiments, for each media item, the user profile information, caption, user location, and media item location (geocode) are split into words. These words are used to calculate the following scores:

Synonym score: Calculate the exact word matching between query and post text. It calculates the common set of words between the caption of the image and the query and uses the following formula to calculate the score:

$$S_{synset} = \frac{\sum_{i}^{len\left(set_{querywords}\, \&\, set_{captionwords}\right)} -\log(p(w_i))}{\sum_{j}^{len\left(set_{querywords}\right)} -\log(p(w_j))}$$

Credibility score: The credibility of a media item is obtained from associating the source with the query.

Counts the number of news-related keywords in the user info (e.g. anchorman, cameraman, photographer)

Counts the number of retweets (logarithmically) and uses this to find a credibility.

Geographic score: When the location extracted from the query matches the location of the media item within a given radius or matches the location mentioned in the user information within a given radius, a score is assigned to the media item.

In some embodiments, for each media item, the words described above will be converted to a vector of numbers and named entities will be found within the text using the library SpaCy. These vectors and named entities are used to calculate the following scores below:

Vector score: In some embodiments, the cosine similarity of query vector and the caption vector. Vectors are log probability-weighted sum of word vectors.

$$s_{cos} = \cos\left(\sum_{i}^{len(query)} -\log(p(w_i))v_{w_i},\ \sum_{i}^{len(postwords)} -\log(p(w_i))v_{w_i}\right)$$

Named Entity Recognition (NER) score: In some embodiments, this is the percentage of named entities present in query also present in media text.

Out of all of the named entities extracted from the caption, the percentage of matched named entities between those extracted from caption and those extracted from the query.

$$s_{post} = \sum_{i \in \{synset, credibility, geo, NER, cos\}} \theta_i s_i$$

The above scores can be improved by using the same scores as features and training a support vector machine (hereby denoted by SVM) or a sigmoid classifier to finetune the weightage of each of the scores described above.

In some embodiments, for each media with an image or thumbnail from a video, the perception and difference hashes are calculated. Both of these hashes convert the image to a string format that is stored in the database.

In some embodiments, the hash stored in the database is checked against any other hashes in the database to find duplicate visual content. The algorithm identifies the earliest of any duplicates and flags each item as distinct visually or not.

In some embodiments, for each media, the textual information is converted to a string hash and is stored into the database.

In some embodiments, the textual hash in the database is checked against any other such hashes in the database to find duplicate textual content. The algorithm identifies the earliest of any duplicate text and flags each item as distinct textually or not.

The above described algorithms are applied to all social media posts with or without multimedia content.

Visual Filter

In some embodiments, the visual and audio tags and features generated from "Extract Information from Images and Videos" are used and passed to the visual filter in order to filter the media items that correlate best to the query and those that do not.

In some embodiments, the visual tags extracted from the extraction module is compared against the list of keywords generated from the "Search Query Generation" step (from Google Knowledge Graph, etc.). posts that do not include visual tags extracted are filtered out of the result set.

In some embodiments, visual tags that include illustrations or text are not considered original and are filtered out of the search results.

Real-Time Searching for Social Media Content

Aggregator

In some embodiments, one Aggregator module is called regularly after every delta of time specified in the configuration. It performs the following tasks on all media content associated with an active user query that is received from a separate cronjob specifically created for the aggregator.

In some embodiments, for all media content in a query, the aggregator generates cropped images and extracts sub-image features using histogram features detailed in "Visual Models"

In some embodiments, the image features generated are clustered with hierarchical clustering for near-duplicate detection where the user specifies a distance threshold as an input to the hierarchal clustering algorithm. Each media item is then identified as distinct or not distinct and the database is updated for each element.

Streaming Query Generation

In some embodiments, the Streaming Query Generator module is called regularly after every delta of time specified in the configuration if there has been a sufficient number of posts for the specified active query found and processed from the last time the Streaming Query Generator ran for this active query. When it processes the active query it does the following steps In some embodiments, for the given query, all of the captions for every media item is analyzed and a TF-IDF (Term Frequency-Inverse Document Frequency) is calculated for the complete unique set of terms extracted from all post captions for the query.

In some embodiments, the TF-IDF score calculated is ranked in decreasing order and a configurable number of the top terms are deemed the "streaming_keywords" and are saved to the database for use in other parts of our system.

Verification of Social Media Content+Source

From all the relevant media items, it is also essential we understand all information about the content in order to provide the customer a snapshot of how credible the multimedia found online is with respect to their query and the event and context surrounding it.

We have adopted and mapped a correlation between the questions that are asked by investigators and reporters and the data sources that we have obtained. In the chart below, on the left we have the questions that are being asked and on the right we have the data points that we obtain and present to answer each one of these questions. The details in the chart here are just some embodiments. More embodiments are possible with more metadata.

Audio Models

These audio models enable speech transcription and are utilized for the audio extraction of information detailed in the sections above. In some embodiments, the neural network used for the speech transcription is an open source model from Kaldi (http://kaldi-asr.org/doc/online_decoding.html#online_decoding_nnet2).

Visual Models

Introduction

Since the ground-breaking results during the Large Scale Visual Recognition Challenge (ILSVRC) 2012 competition using AlexNet there has been a dramatic improvement in the field of computer vision due to deep learning. Most of the research focused on single object classification or multi-object detection. Considering real world scenarios, most of the images or video frames don't consist of a single object being predominant in them. Hence, there is a requirement of using multi-label classification models which can be used for real-world scenarios. Algorithms such as R-CNN, Faster R-CNN and YOLO attempt to solve the problem of detection and localization of objects by providing bounding boxes to locate these objects. These algorithms in overview take an input image, propose regions in the images and then use Deep Convolutional Neural Network in order to generate features and classify them. Although, this classifies multiple objects and localizes them it requires training using the bounding boxes of all objects present in the image. At a time when data is important for making better computer vision models, it causes delay in making better and faster models using the classes present in the image. It also affects scalability with respect to large number of classes. For example, Microsoft COCO dataset provides only 80 object categories and PASCAL VOC dataset provides only 20 object categories and creating such datasets consume lot of manual work. The testing time in these models also gets higher due to generation of region proposals followed by final classification for all regions. Most of the real-world problems related to media search and discovery rely upon the understanding of the multiple classes present without any requirement of where exactly it is located.

Hence, in order to address the above problems faced in the real-world scenario for search and discovery, a multi-class classifier called acuNet has been developed. This model provides solution for large number of classes (scalability of classes) for real world scenarios without any requirement of location of these objects in the images.

2. Related Work and Context

After the AlexNet model most of the computer vision models addressed detection and localization of the objects in images and videos such as in R-CNN, Faster R-CNN and YOLO. However, they create a requirement of having bounding boxes for training these models when labeled training data is scarce and thus causing constraints in number of classes for which it's trained.

Object detection using R-CNN consists of three modules. It takes an input image, proposes around 2000 category-independent regions. It then uses these region proposals as a set of candidates for their category-detector. These sub-images are given as an input to a large convolutional neural network (CNN) which is the second module. Thus, creating around 2000 features for these sub-images. It finally uses third module, a class-specific State Vector Machines (SVMs) in order to classify regions. The problem faced in this is due to testing time as it needs to generate many region proposals and then create features for all of them. To address this problem, Fast R-CNN, followed by Faster R-CNN were proposed. In faster R-CNN, they introduce a Region Proposal Network (RPN) that shares full-image convolutional features with the detection network thus decreasing the time for region proposals. Training of this model is done as a single-stage and a multi-task loss. The outputs used here are the softmax layer providing the probabilities for classes and a bounding box regressor for localizing the objects.

Another object detection algorithm, YOLO—You Only Look Once provides a unified pipeline. It addresses this as a regression problem to spatially separated bounding boxes and associated class probabilities. Single neural network predicts bounding boxes and probabilities in a single forward pass. As observed, the above models create a necessity of using training dataset having bounding boxes which creates a bottleneck to create models for multi-label classes due to the sparsely labeled data for few number of classes.

Hypotheses-CNN-pooling addresses the multi-label classification problem. In this model, an arbitrary number of object segment hypotheses are connected to a shared CNN. Finally, the CNN output results from different hypotheses that are aggregated with max-pooling to produce multi-label predictions. This model doesn't require ground-truth bounding box information for training. However, in this model, bottleneck comes due to proposition of multiple regions extracted by an algorithm called Binary Normed Gradients (BING). After the region proposals, it empirically filters out most hypothesis using areas or height/width ratios. Finally, top few hypothesis with high predictive scores are used as input into CNN. Features generated by all the hypothesis is then max-pooled(fusion) before generating multi-labels. Thus, there is time requirement in generating hypothesis regions followed by testing for all these regions using their shared CNN.acuNet addresses this by having only one single feed forward for the entire image and generating multi-label classifications. The important aspect of acuNet is the usage of novel loss function and to use binary sigmoidal function for every class.

In this work, we propose acuNet, where an image is given as an input into this CNN and finally the CNN feature for that image is given as input into N (number of classes) number of independent binary sigmoidal functions to generate probabilities for all classes to produce the multi-label predictions. Some novel characteristics of this deep CNN infrastructure include: 1) Bounding box information is not required for training; 2) Single feedforward to generate multi-labels for the entire image; 3) Usage of loss function which takes consideration of the ratio of number of positive labels to negative labels in every image, 4) Transfer learning can also be applied with any single-label CNN model, e.g. AlexNet.

3. Motivation

Considering, real world problems of media search and discovery, speed is extremely important. It is sufficient to only know all classes present in the media and not know where it's present. acuNet addresses the key problem of extracting information for large number of classes and thereby improving the speed and accuracy of media search and discovery. In order to address the number of parameters in the CNN model for training, it finds inspiration from ILSVRC14 winning architecture, GoogLeNet, which uses an inception module and decreases the number of parameters significantly and requires fewer training images to achieve better accuracy and also decrease the feed-forward time due to fewer mathematical computations.

4. Architectural Details

Inception Module:

Most neural networks prior to GoogLeNet, were stacked with blocks of convolution layers, max-pool layers, nonlinear activation layers followed by fully connected layers and finally a classifier. These models were made deeper using more layers and more training images. As models become deeper, the number of parameters in the CNN model increases superlinear. To address this issue, using 1×1 Convolutions in between two layers changes the dimensionality in the filter space. It is a 1×1 filter, zero padding and stride 1 with fewer filters in order to move into lower dimensional embedding.

Instead of Having Single Convolution this Module has a Composition of Four Networks, i.e.

(i) Average 3×3 max pooling (stride 1, pad 1) followed by 1×1 Convolution (Conv) layer (ii) 1×1 Conv Layer (iii) 1×1 Conv followed by 3×3 Conv Layer (stride 1, pad 1)

(iv) 1×1 Conv followed by 5×5 Conv Layer (stride 1, pad 2)

At the top, outputs of each of them are concatenated. This improves the performance of the model by giving it the ability to extract different features using multiple different Conv layers rather than just one. These conv layers are followed by rectified linear activation (ReLU).

Loss Function for Multi-Label Classification:

The final layer for the classifier comprises of binary sigmoidal classifier where the size is the number of classes (labels). The training loss function is a sum of weighted sigmoidal cross-entropy and weighted L2 regularization of probabilities for each class ($p\_i$) with parameter $\lambda$.

$$\text{Loss} = E + \lambda \sum_{i}^{O(classes)} p_i^2$$

$$E = -\frac{1}{N}\sum_{n=1}^{N}[(1-\alpha)p_n\log\hat{p}_n + \alpha(1-p_n)\log(1-\hat{p}_n)]$$

$$\alpha = \frac{1}{N}\sum_{i=1}^{N}\frac{O(negatives)}{N}; 1-\alpha = \frac{1}{N}\sum_{i=1}^{N}\frac{O(positives)}{N}$$

$$N = O(classes)$$

The weighted sigmoidal cross-entropy considers every class as independent classification problem which are weighted based on penalizing higher for predicting negative classes(decreasing false positives). The reason for this is in case when there are large number of classes (more than 1000), the number of positive classes in every image ranges around 1-10. Thus, O(positives)<<O(negatives) and thus penalizing both positive and negative predictions at the same weightage would bias the model to give more false positives. Cross entropy essentially computes the sum of binary misclassification costs using "many-hot" label vector which makes $p\_n$ to be 0 or 1 for all N classes.

acuNet:

The architecture of acuNet was built with a preference for practicality and real-time computation. Thus we focused on decreasing the number of computations. Table 1 illustrates the model architecture of acuNet along with the multi-label classifier using unnormalized sigmoid probabilities. This is one embodiment of the multi-label classifier.

We use an exponential linear unit (elu) activation layer for the fully-connected layer. The above describes the architecture with possibilities of improvement either by increasing its width or the depth.

5. Training Methodology

Dynamic Training Pipeline:

The training of these models require many images for training. Hence, there is a requirement of having a dynamic system in order to scrape more images with minimal requirement of human involvement. Hence, we developed a dynamic platform to allow us do the same. Please find more information about this in "Visual Training Data" pipeline.

Number of Training Images and Method of Labeling:

In some embodiments, for training a model we started with using 810,000 images, or any reasonable number of training images. More images can be added in order to improve it further and are done in the Dynamic Training Pipeline described above. The labeling of this data contains multiple tags given by human input. Class labels use names which are in colloquial english making it easy to scale the models for large number of classes. It presently has around 4000 classes which will further increase with more labeled images as described in the Dynamic Training Pipeline. The following graph depicts the accuracies for classes above a prediction probabilities of 0.7 and 0.99 from the final sigmoidal functions vs different epoch number.

6. Conclusions

The model shows the usage of multi-label sigmoid classifier in order to generate labels for images and video frames. This model decreases the requirement of using bounding box information for training and uses a single feed forward network for the entire image. It also uses inception models in order to move from sparse to dense structures which helps in improving its performance with a reasonable number of training images. Thus, the model performs faster to be usable for real-world, real-time applications.

The foregoing description, for purpose of explanation, has been described with reference to specific embodiments. However, the illustrative discussions above are not intended to be exhaustive or to limit the present disclosure to the precise forms disclosed. Many modifications and variations are possible in view of the above teachings. The embodiments were chosen and described in order to best explain the principles of the present disclosure and its practical applications, to thereby enable others skilled in the art to best utilize the present disclosure and various embodiments with various modifications as are suited to the particular use contemplated.

Figure 3:
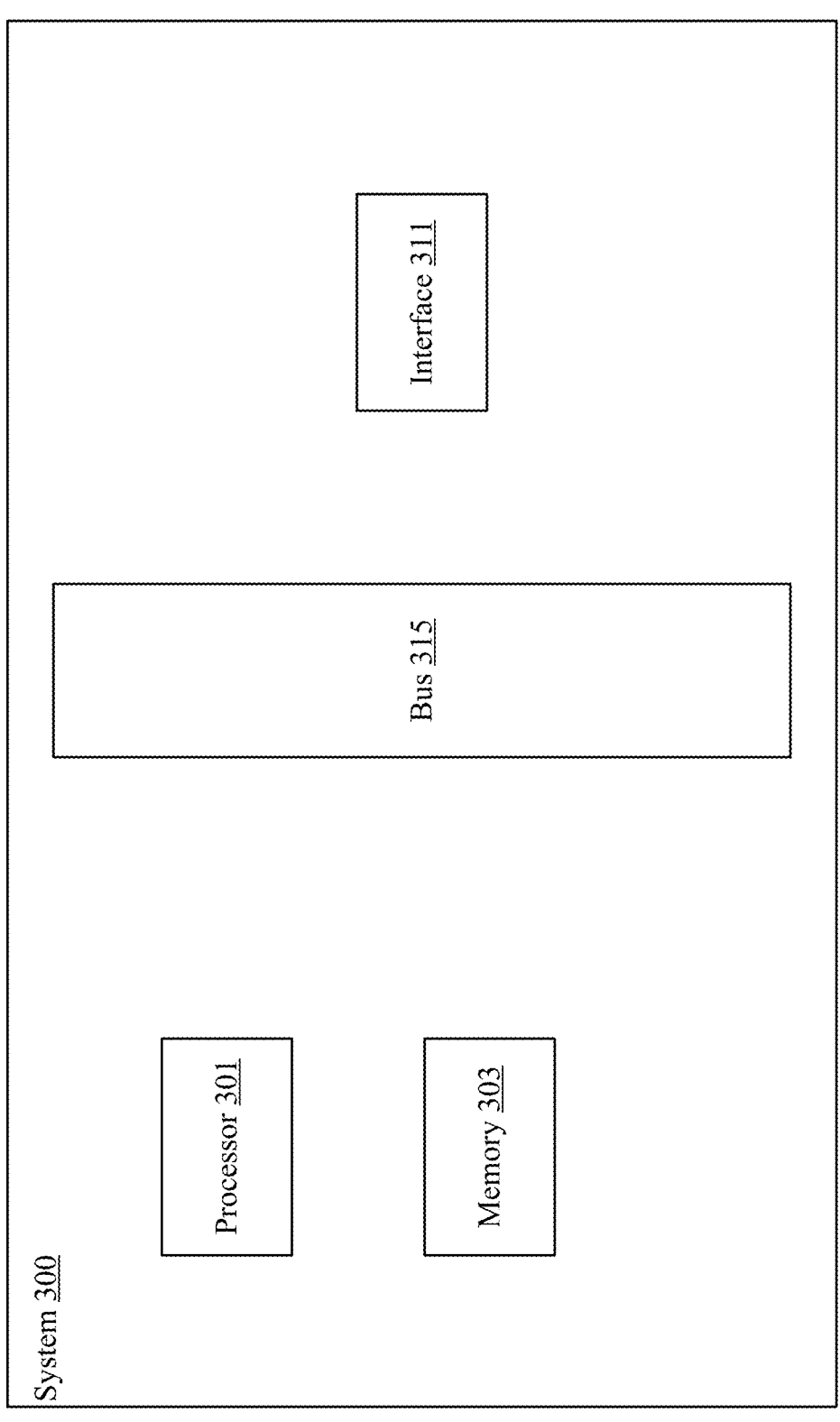
FIG. 3 illustrates a particular example of a system that can be used with various embodiments of the present disclosure.

Various computing devices can implement the methods described. For instance, a mobile device, computer system, etc. can be used to generate artificially rendered images. With reference to FIG. 3, shown is a particular example of a computer system that can be used to implement particular examples of the present disclosure. For instance, the computer system 300 can be used to any of the methods according to various embodiments described above. According to particular example embodiments, a system 300 suitable for implementing particular embodiments of the present disclosure includes a processor 301, a memory 303, an interface 311, and a bus 315 (e.g., a PCI bus). The interface 311 may include separate input and output interfaces, or may be a unified interface supporting both operations. When acting under the control of appropriate software or firmware, the processor 301 is responsible for such tasks such as optimization. Various specially configured devices can also be used in place of a processor 301 or in addition to processor 301. The complete implementation can also be done in custom hardware. The interface 311 is typically configured to send and receive data packets or data segments over a network. Particular examples of interfaces the device supports include Ethernet interfaces, frame relay interfaces, cable interfaces, DSL interfaces, token ring interfaces, and the like.

In addition, various very high-speed interfaces may be provided such as fast Ethernet interfaces, Gigabit Ethernet interfaces, ATM interfaces, HSSI interfaces, POS interfaces, FDDI interfaces and the like. Generally, these interfaces may include ports appropriate for communication with the appropriate media. In some cases, they may also include an independent processor and, in some instances, volatile RAM. The independent processors may control such communications intensive tasks as packet switching, media control and management.

According to particular example embodiments, the system 300 uses memory 303 to store data and program instructions and maintained a local side cache. The program instructions may control the operation of an operating system and/or one or more applications, for example. The memory or memories may also be configured to store received metadata and batch requested metadata.

Because such information and program instructions may be employed to implement the systems/methods described herein, the present disclosure relates to tangible, machine readable media that include program instructions, state information, etc. for performing various operations described herein. Examples of machine-readable media include hard disks, floppy disks, magnetic tape, optical media such as CD-ROM disks and DVDs; magneto-optical media such as optical disks, and hardware devices that are specially configured to store and perform program instructions, such as read-only memory devices (ROM) and programmable read-only memory devices (PROMs). Examples of program instructions include both machine code, such as produced by a compiler, and files containing higher level code that may be executed by the computer using an interpreter.

Although many of the components and processes are described above in the singular for convenience, it will be appreciated by one of skill in the art that multiple components and repeated processes can also be used to practice the techniques of the present disclosure.

While the present disclosure has been particularly shown and described with reference to specific embodiments thereof, it will be understood by those skilled in the art that changes in the form and details of the disclosed embodiments may be made without departing from the spirit or scope of the disclosure. It is therefore intended that the disclosure be interpreted to include all variations and equivalents that fall within the true spirit and scope of the present disclosure.

What is claimed is:

1. A system comprising:
one or more processors;
memory; and
one or more programs stored in the memory, the one or more programs comprising instructions for:
building a machine learning model using a graphical user interface (GUI) and a command line interface (CLI), the GUI and the CLI connecting to an application programming interface (API);

training the machine learning model to produce and track a plurality of snapshots of the machine learning model using the GUI through an adjustment of weights in a repeated process, each snapshot being a self-contained, reproducible version of the machine learning model that includes all relevant components for reproducing the machine learning model, including source code, files, environments, configurations, and performance metrics, wherein each snapshot can be used to fully reproduce the machine learning model in multiple different environments;

producing a change facilitator tool based on the plurality of snapshots of the machine learning model;

sharing the change facilitator tool to one or more devices such that each device can obtain one or more of the plurality of snapshots of the machine learning model; and facilitating deployment of one or more of the plurality of snapshots of the machine learning model.

2. The system of claim 1, wherein tracking the plurality of versions includes tracking one or more of the following components: source code, software environments, files, configuration parameters, and performance metrics.

3. The system of claim 2, wherein more than one component is tracked at the same time.

4. The system of claim 3, wherein each version in the plurality of versions is a snapshot of the one or more components being tracked.

5. The system of claim 4, wherein a snapshot allows for reproducing a version of the machine learning model across a plurality of machines.

6. The system of claim 1, wherein the plurality of versions of the machine learning model is stored in persistent storage.

7. The system of claim 1, wherein the change facilitator tool is downloaded onto one or more devices.

8. A method comprising:
building a machine learning model using a graphical user interface (GUI) and a command line interface (CLI), the GUI and the CLI connecting to an application programming interface (API);

training the machine learning model to produce and track a plurality of snapshots of the machine learning model using the GUI through an adjustment of weights in a repeated process, each snapshot being a self-contained, reproducible version of the machine learning model that includes all relevant components for reproducing the machine learning model, including source code, files, environments, configurations, and performance metrics, wherein each snapshot can be used to fully reproduce the machine learning model in multiple different environments;

producing a change facilitator tool based on the plurality of snapshots of the machine learning model;

sharing the change facilitator tool to one or more devices such that each device can obtain one or more of the plurality of snapshots of the machine learning model; and facilitating deployment of one or more of the plurality of snapshots of the machine learning model.

9. The method of claim 8, wherein tracking the plurality of versions includes tracking one or more of the following components: source code, software environments, files, configuration parameters, and performance metrics.

10. The method of claim 9, wherein more than one component is tracked at the same time.

11. The method of claim 10, wherein each version in the plurality of versions is a snapshot of the one or more components being tracked.

12. The method of claim 11, wherein a snapshot allows for reproducing a version of the machine learning model across a plurality of machines.

13. The method of claim 8, wherein the plurality of versions of the machine learning model is stored in persistent storage.

14. The method of claim 8, wherein the change facilitator tool is downloaded onto one or more devices.

15. A non-transitory computer readable storage medium storing one or more programs configured for execution by a computer, the one or more programs comprising instructions for:

building a machine learning model using a graphical user interface (GUI) and a command line interface (CLI), the GUI and the CLI connecting to an application programming interface (API);

training the machine learning model to produce and track a plurality of snapshots of the machine learning model using the GUI through an adjustment of weights in a repeated process, each snapshot being a self-contained, reproducible version of the machine learning model that includes all relevant components for reproducing the machine learning model, including source code, files, environments, configurations, and performance metrics, wherein each snapshot can be used to fully reproduce the machine learning model in multiple different environments;

producing a change facilitator tool based on the plurality of snapshots of the machine learning model;

sharing the change facilitator tool to one or more devices such that each device can obtain one or more of the plurality of snapshots of the machine learning model; and facilitating deployment of one or more of the plurality of snapshots of the machine learning model.

16. The non-transitory computer readable storage medium of claim 15, wherein tracking the plurality of versions includes tracking one or more of the following components: source code, software environments, files, configuration parameters, and performance metrics.

17. The non-transitory computer readable storage medium of claim 16, wherein more than one component is tracked at the same time.

18. The non-transitory computer readable storage medium of claim 17, wherein each version in the plurality of versions is a snapshot of the one or more components being tracked.

19. The non-transitory computer readable storage medium of claim 18, wherein a snapshot allows for reproducing a version of the machine learning model across a plurality of machines.

20. The non-transitory computer readable storage medium of claim 15, wherein the plurality of versions of the machine learning model is stored in persistent storage.

* * * * *